United States Patent
Stössel et al.

(10) Patent No.: US 7,060,369 B2
(45) Date of Patent: Jun. 13, 2006

(54) USE OF BORON AND ALUMINUM COMPOUNDS IN ELECTRONIC COMPONENTS

(75) Inventors: Philipp Stössel, Frankfurt (DE); Hubert Spreitzer, Viernheim (DE); Heinrich Becker, Glashütten (DE); Jacqueline Drott, Riedstadt (DE)

(73) Assignee: Covion Organic Semiconductors GmbH (DE)

( * ) Notice: Subject to any disclaimer, the term of this patent is extended or adjusted under 35 U.S.C. 154(b) by 0 days.

(21) Appl. No.: 10/250,594

(22) PCT Filed: Dec. 20, 2001

(86) PCT No.: PCT/EP01/15176

§ 371 (c)(1), (2), (4) Date: Oct. 30, 2003

(87) PCT Pub. No.: WO02/052661

PCT Pub. Date: Jul. 4, 2002

(65) Prior Publication Data

US 2004/0058194 A1    Mar. 25, 2004

(51) Int. Cl.
*H01L 51/50* (2006.01)
*H05B 33/14* (2006.01)

(52) U.S. Cl. ............... 428/690; 428/917; 313/504; 313/506

(58) Field of Classification Search ......... 428/690, 428/917; 313/504, 506; 252/301.16; 556/7, 556/27
See application file for complete search history.

(56) References Cited

U.S. PATENT DOCUMENTS

| 6,118,212 A * | 9/2000 | Nakaya et al. ............. 313/503 |
| 6,287,713 B1 | 9/2001 | Heuer et al. |
| 6,376,107 B1 | 4/2002 | Heuer et al. |

FOREIGN PATENT DOCUMENTS

| EP | 0 933 972 | 8/1999 |
| EP | 0 969 531 | 1/2000 |
| EP | 1 142 895 | 10/2001 |
| JP | 2000290645 | 10/2000 |
| WO | WO-98/36035 | 8/1998 |
| WO | WO-00/40586 | 7/2000 |

OTHER PUBLICATIONS

J.P.O. machine translation for JP 2000-290645 A, published Oct. 17, 2000, no page Nos.*
Noda et al., J. Am Chem. Soc., (1998) (no month), vol. 120, pp. 9714-9715.*
Noda et al., Adv. Materials, (1999) (no month), vol. 11, No. 4, pp. 283-285.*
Shirota et al., SPIE vol. 3797, Jul. 1999, pp. 158-169.*
Shirota et al., J. Am. Chem. Soc., Oct. 2000, vol. 122. pp. 11021-11022.*
Yuan et al., Journal of Solid State Chemistry, vol. 154, (2000) (no month), pp. 5-12.*

* cited by examiner

*Primary Examiner*—Dawn L. Garrett
(74) *Attorney, Agent, or Firm*—Connolly Bove Lodge & Hutz

(57) ABSTRACT

The present invention relates to the use of boron and aluminum compounds in electronics, in particular as electron transport material, as host material of the emission layer and as hole blocking material, in each case in phosphorescent OLEDs, and also to layers produced therefrom in phosphorescent OLEDs.

9 Claims, No Drawings

USE OF BORON AND ALUMINUM COMPOUNDS IN ELECTRONIC COMPONENTS

The present invention relates to the use of boron and aluminum compounds in electronics, in particular in phosphorescent OLED devices.

In a variety of different applications, which can in the broadest sense be considered parts of the electronics industry, the use of organic compounds as active components (=functional materials) has been reality for some time or is expected in the near future.

Thus, charge transport materials based on organic compounds (generally hole transport materials based on triarylamines) have been used for many years in copiers.

The use of specific semiconductive organic compounds, some of which are also capable of emission of light in the visible region of the spectrum, is just at the beginning of introduction onto the market, for example in organic electroluminescence devices.

The use of organic charge transport layers in applications such as organic integrated circuits (organic ICs) and organic solar cells has already progressed a long way, at least in the research stage, so that introduction onto the market may be expected within the next few years.

The number of further possibilities is very large, but frequently only as a modification of the above-described processes, as evidenced by the examples of organic solid-state laser diodes and organic photodetectors.

In some of these modern applications, development has sometimes already progressed a long way, but there is still, depending on the application, a tremendous need for technical improvements.

Organic electroluminescence devices and their individual components, viz. organic light-emitting diodes (OLEDs) have already been introduced on to the market, as evidenced by the commercially available automobile radios having an "organic display" from Pioneer. Further such products will be introduced shortly.

Nevertheless, considerable improvements are still necessary to make these displays truly competitive with the liquid crystal displays (LCDs) which dominate the market at present, or to make it possible for the LCDs to be overtaken.

One relative development which has appeared in the last two years is the use of organometallic complexes which display phosphorescence instead of fluorescence [M. A. Baldo, D. F. O'Brian, Y. You, A. Shoustikov, S. Sibley, M. E. Thompson, S. R. Forrest, Nature, 1998, 395, 151–154; M. A. Baldo, S. Lamansky, P. E. Burrows, M. E. Thompson, S. R. Forrest, Applied Physics Letters, 1999, 75, 4–6], and which can as a result, for theoretical statistical reasons, give a three- to four-fold improvement in the energy and power efficiency. However, whether this new development will become established depends greatly on whether corresponding device compositions which can apply these advantages (triplet emission=phosphorescence compared to singlet emission=fluorescence) in OLEDs can be found. Requirements include, for example, a long operating life, a high heat resistance, a low use and operating voltage so as to make mobile applications possible, to name only a few.

The general structure of organic electroluminescence devices is described, for example, in U.S. Pat. Nos. 4,539,507 and 5,151,629.

An organic electroluminescence device usually consists of a plurality of layers which are preferably applied on top of one another by means of vacuum methods. These layers are specifically:

1. a support plate=substrate (usually glass or a plastic film);
2. a transparent anode (usually indium-tin oxide, ITO);
3. a hole injection layer (=HIL): e.g. one based on copper phthalocyanine (CuPc), conductive polymers such as polyaniline (PANI) or polythiophene derivatives (e.g. PEDOT);
4. a hole transport layer (=HTL): usually based on triarylamine derivatives;
5. an emission layer (=EML): this layer can sometimes coincide with the layers 4 or 6, but is usually made up of host molecules doped with fluorescent dyes or phosphorescent dyes;
6. an electron transport layer (=ETL): mostly based on aluminum tris-8-hydroxyquinoxalinate ($AlQ_3$);
7. an electron injection layer (=EIL): this layer can sometimes coincide with the layer 6 or a small part of the cathode is specially treated or specially deposited;
8. a cathode: use is here generally made of metals, metal combinations or metal alloys having a low work function, e.g. Ca, Ba, Mg, Al, In, Mg/Ag.

This overall device is naturally appropriately (depending on the application) structured, provided with contacts and finally hermetically sealed, since the life of such devices is generally reduced drastically in the presence of water and/or air.

On application of an appropriate voltage, holes from the anode and electrons from the cathode are injected into the device and these meet in the device to produce an excited state. This can decay with emission of light. This light is radiated through the transparent anode. In some applications, it can be useful to invert the arrangement, i.e. to use a (semi)transparent cathode when the anode is, for example, applied to a nontransparent substrate (for example a silicon chip).

For the new phosphorescent OLED devices, it can also be advantageous to insert further thin layers which block individual charge carriers (e.g. hole blocking layers=HBLs).

In any case, the individual OLED will emit light which has a color determined by the EML. In this way, it is possible to generate the three basic colors (blue, green, red) depending on the EML.

Suitable combinations of various individual OLEDs then makes it possible to produce a variety of devices starting from individual light-emitting diodes through simple segmented displays and more complicated matrix displays to full-color, large-area displays/VDUs.

In the case of the abovementioned OLED device, the functional materials mentioned above have been or are being intensively optimized.

However, it is conspicuous that $AlQ_3$ is used virtually exclusively as ETL in all devices. This compound is, as mentioned above, frequently also used as host material for the EML. Although many attempts have been made to replace this compound by other substances, these have not succeeded to date. $AlQ_3$ still represents the best compromise for the various requirements. Thus, the compound has a high thermal stability (glass transition temperature $T_g \sim 180°$ C.) combined with an obviously usable band position and an acceptable fluorescence quantum efficiency in the solid (about 40%). However, a negative aspect is the intrinsic color (absorption: yellow) of the compound which specifically in the case of blue OLEDs can lead to fluorescence absorption and reemission to produce color shifts. This is a serious disadvantage in the abovementioned device structure in which the light is emitted through the cathode, i.e. through the ETL as well. In this case, blue OLEDs can be produced only with a serious deterioration in efficiency or color shade.

The usability of AlQ₃ in the new phosphorescent OLEDs has also not been finally clarified.

A further disadvantage of the use of AlQ₃ is the instability in the presence of holes [cf., for example, Z. Popovic et al., Proceedings of SPIE, 1999, 3797, 310–315] which is now known from the literature and which can lead to problems in the device in long-term use.

A critical practical disadvantage of AlQ₃ is the strongly hygroscopic nature of this compound. AlQ₃ which is synthesized and stored under normal conditions still contains one molecule of water in addition to the hydroxyquinoline ligands per molecule of complex [cf., for example: H. Schmidbaur et al., Z. Naturforsch. 1991, 46b, 901–911]. This is extremely difficult to remove. For use in OLEDs, AlQ₃ therefore has to be laboriously purified in a complicated, multistage sublimation process and subsequently stored and handled in the absence of water under a protective gas atmosphere. Furthermore, wide fluctuations in the quality of individual AlQ₃ batches and a poor shelf life have been found (S. Karg, E-MRS conference May 30–Jun. 2, 2000, Strasbourg).

For the new phosphorescent OLEDs, AlQ₃ is likewise used as ETL but the question of the host material for the actual triplet emitter has not been answered at all. The use of only few materials (4,4'-biscarbazolylbiphenyl, polyvinylcarbazole and a triazole derivative) has been reported to date. However, the operating lives in particular are still in great need of optimization.

It has surprisingly been found that particular boron or aluminum compounds display excellent properties when used as ETL, as HBL or as host material in the EML. Use in the new phosphorescent OLED devices in particular is very advantageous. The use of these compounds in phosphorescent organic electroluminescence devices is subject matter of the present invention.

Compared to AlQ₃ and the few host materials known to date for phosphorescent OLEDs, the compounds have the following properties:

1. They are colorless or virtually colorless; this means that their UV/VIS absorption in the wavelength range from 400 to 700 nm is negligible. In the electroluminescence devices according to the invention, this leads to a better color purity and a higher efficiency. This has the advantage that, especially in the case of blue OLEDs, they do not lead to a color shift or a reduction in efficiency. A further advantage is naturally their use as host or ETL material in inverted (cf. above) device geometries.
2. When the boron or aluminum compounds described are used as host or ETL material in the electroluminescence devices according to the invention, they lead to high efficiencies which are, in particular, independent of the current densities used. This makes very good efficiencies possible even at high current densities.
3. The boron or aluminum compounds described have a high oxidation stability. For use in appropriate devices according to the invention, this can lead to a significant increase in the operating life. Furthermore, the production of these devices is simplified.
4. The boron or aluminum compounds described display no noticeable hygroscopic behavior and have a high stability toward atmospheric oxygen. Storage for a number of days or weeks in the presence of air and water vapor leads to no changes in the substances. An addition reaction of water with the compounds cannot be detected. This naturally has the advantage that the substances can be purified, transported, stored and prepared for use under simpler conditions. In contrast to operations using AlQ₃, use does not have to take place entirely under protective gas.
5. The boron or aluminum compounds described can be prepared in a readily reproducible fashion in reliable high purity and display no fluctuation between batches. An industrial process for producing the electroluminescence devices according to the invention is therefore substantially more efficient.
6. The boron or aluminum compounds described also have a high thermal stability. However, this is not mentioned here as a decisive advantage, but it should merely be pointed out that this property, too, is achieved very satisfactorily by the boranes or organoaluminum compounds.
7. The boron or aluminum compounds described have an excellent solubility in organic solvents. These materials can therefore also be processed from solution by means of coating or printing techniques. This property is also advantageous in the customary processing by vaporization, so that cleaning of the plants or the masks used is made considerably easier.

Only a few instances of the use of boron-containing compounds in OLED devices have hitherto been described.

Thus, Y. Shirota (e.g. Y. Shirota et al., Adv. Mater. 1999, 11, 283) describes a bisthiophene-bisborane compound in OLEDs. However, mention is made here of, inter alia, exciplex formation with hole transport layers, which indicates morphological instability.

WO 00/40586 discloses monoborane compounds which, according to our investigations, are unsuitable for use in long-lived OLEDs, since they are unstable in long-term operation. This is presumably attributable to the charged species not being completely stable or the thermal stability of these compounds not being high enough.

Furthermore, oligoboryl compounds (mainly with anthracene bridges or substituents) have also been disclosed and are described, by the same authors, in *J. Am. Chem. Soc.*, 2000, 122, 6335. A significant disadvantage of these compounds also becomes clear here: they have a strong absorption in the visible light range (cf. loc. sic., FIG. 2).

In JP-2000-290645 and JP-2000-290373, M. Tamano et al. report various borane compounds in OLED applications. However, nothing is said here about possible use in the abovementioned new phosphorescent OLEDs.

To be able to be used as electroluminescence materials, the boron or aluminum compounds are applied in the form of a film to a substrate, generally by known methods with which those skilled in the art are familiar, e.g. vacuum deposition or from solution by spin coating or using various printing methods (e.g. inkjet printing, offset printing, etc.).

Even though the above statements may describe use of the boron or aluminum compounds in OLED devices, it may be pointed out that these compounds can likewise be used very successfully in the following devices:

1. Use in organic solar cells as electron acceptor or electron transport material.
2. Use in organic ICs as charge transport layer.
3. Use in further applications, some of which have been mentioned above, e.g. organic solid-state lasers or organic photodetectors.

The present invention accordingly provides for the use of substituted boron or aluminum compounds of the formula (I)

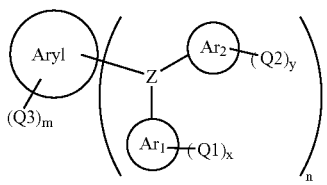

where the symbols and indices have the following meanings:

| | |
|---|---|
| Aryl | is a carbocyclic or heterocyclic aromatic ring or ring system having from 2 to 60 carbon atoms or a plurality of aromatic rings which each have from 6 to 14 carbon atoms and are joined to one another via a conjugated or nonconjugated linkage or via one or more metal atoms (sandwich complex); |
| $Ar_1$, $Ar_2$ | are identical or different on each occurrence and are each phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinolinyl, 2- or 3-pyrrolyl, 2- or 3-furanyl or 2-(1, 3, 4-oxadiazol)yl; |
| Q1, Q2, Q3 | are identical or different on each occurrence and are each CN, F, Cl or a straight-chain or branched or cyclic alkyl or alkoxy group which has from 1 to 20 carbon atoms and in which one or more nonadjacent $CH_2$ groups may be replaced by —O—, —S—, —CO—, —COO—, —O—CO—, —NR$^1$—, —(NR$^2$R$^3$)$^+$A$^-$ or —CONR$^4$— and one or more H atoms may be replaced by F, or an aryl or heteroaryl group which has from 4 to 14 carbon atoms and may be substituted by one or more nonaromatic radicals R'; |
| A$^-$ | is a singly charged anion or its equivalent; |
| R$^1$, R$^2$, R$^3$, R$^4$ | are identical or different and are each H or an aliphatic or aromatic hydrocarbon radical having from 1 to 20 carbon atoms; |
| m | are identical or different and are each 0, 1, 2, 3, 4, 5; |
| x | are identical or different and are each 0, 1, 2, 3, 4, 5; |
| y | are identical or different and are each 0, 1, 2, 3, 4, 5; |
| n | is 2, 3, 4, 5, 6; |
| Z | is boron or aluminum, | in phosphorescent OLED devices.

The boron or aluminum compounds are preferably used in electron transport layers (ETLs), hole blocking layers (HBLs) or as host systems in the emission layer (EML) in the phosphorescent OLEDs. Suitable dopants for this purpose are triplet emitters. In these applications, they display, for example, the advantage that they give a constant brightness in long-term operation even at elevated temperatures (e.g. heating to 130° C. for a number of hours). Furthermore, the voltage to be applied for a given brightness remains largely constant. It is thus not necessary to adjust the voltage in long-term operation in order to maintain an initial brightness. This advantage becomes particularly noticeable in battery operation, since the maximum possible voltage is greatly restricted for economic reasons.

Likewise, devices comprising the boron or aluminum compounds described have a long life and a high EL efficiency.

Preference is given to using boron or aluminum compounds in which Aryl in the formula (I) has one of the following meanings: benzene, biphenyl, 1,2- or 1,3- or 1,4-terphenyl, tetraphenyl, naphthalene, fluorene, phenanthrene, 1,3,5-triphenylbenzene, pyrene, perylene, chrysene, trypticene, [2.2]paracyclophane, ferrocene, pyridine, pyridazine, 4,5-benzopyridazine, pyrimidine, pyrazine, 1,3,5-triazine, pyrrole, indole, 1,2,5- or 1,3,4-oxadiazole, 2,2'- or 4,4'-diazabiphenyl, quinoline, carbazole, 5,10H-dihydrophenazine, 10H-phenoxazine, xanthene, 9-acridine.

The other symbols and indices are as defined above.

Particular preference is given to using boron or aluminum compounds of the formula (I) in which the aryl substituents $Ar_1$ and $Ar_2$ are identical or different and are each phenyl, 1-naphthyl, 2-naphthyl.

The stability, in particular to oxidation, is particularly high when the aryl substituents $Ar_1$, $Ar_2$ are substituted in the ortho and ortho' positions by C1–C20-alkyl-, C1–C20-alkyloxy or C4–C14-aryl groups, and when Z=boron.

Accordingly, the use according to the invention of compounds of the formula (II)

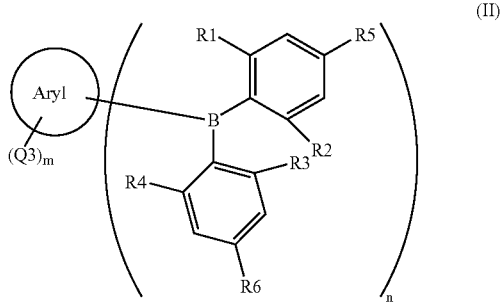

where the symbols and indices have the following meanings:
n is 2, 3, 4, 5, 6;
R1, R2, R3, R4 are identical or different and are each an alkyl, alkyloxy or aryl radical having from 1 to 20 carbon atoms or a corresponding fluoroalkyl or fluoroalkoxy radical;
R5, R6 are identical or different and are each H, CN, F, Cl, Br, I, a straight-chain, branched or cyclic alkyl or alkoxy group, a thioalkyl or thioaryl group, a nitro group, a diarylamino or dialkylamino group or an ester, amide or carboxyl group;

Q3 are identical or different on each occurrence and are each CN, F, Cl or a straight-chain or branched or cyclic alkyl or alkoxy group which has from 1 to 20 carbon atoms and in which one or more nonadjacent $CH_2$ groups may be replaced by —O—, —S—, —CO—, —COO—, —O—CO—, —$NR^1$—, —$(NR^2R^3)^+A^-$ or —$CONR^4$— and one or more H atoms may be replaced by F, or an aryl or heteroaryl group which has from 4 to 14 carbon atoms and may be substituted by one or more nonaromatic radicals R';

$A^-$ is a singly charged anion or its equivalent;

$R^1$, $R^2$, $R^3$, $R^4$ are identical or different and are each hydrogen or an aliphatic or aromatic hydrocarbon radical having from 1 to 20 carbon atoms;

m is 0, 1, 2, 3, 4, 5 is particularly preferred.

Very particular preference is given to using compounds of the formula (II) which have two or three identical boron substituents.

Here, in particular, further substituents (R5, R6) having electron donor or electron acceptor properties in the para position relative to the boron have a significant influence on the electrical and electrooptical properties of the compounds, so that the electrooptical properties can be tailored by appropriate selection of these substituents.

Some compounds which can be used according to the invention are described in detail below.

Aryl in the formula (I) or (II) can correspond to one of the substituted benzenes below,

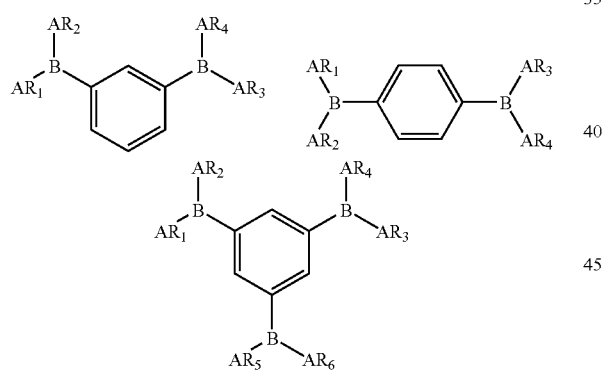

or Aryl in the formula (I) or (II) can correspond to one of the substituted biphenyls below,

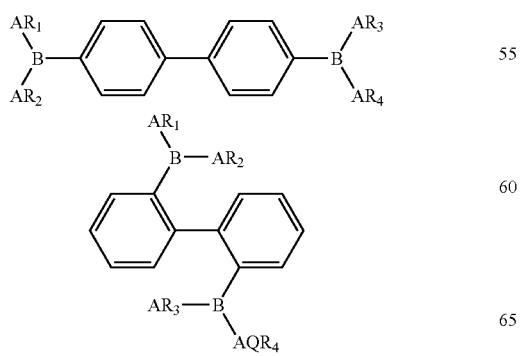

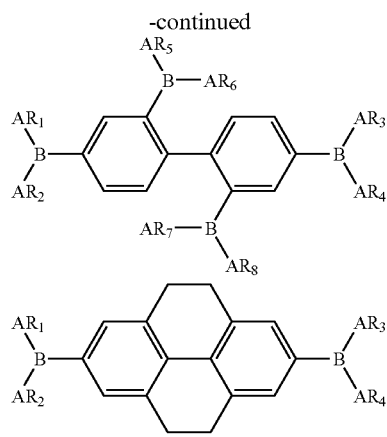

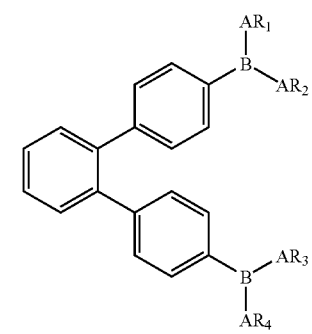

or Aryl in the formula (I) or (II) can correspond to one of the substituted terphenyls below,

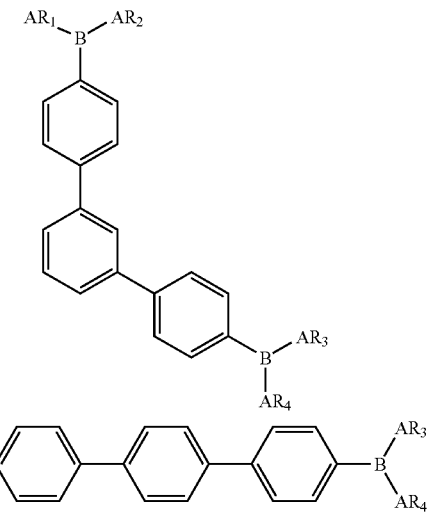

or Aryl in the formula (I) or (II) can correspond to one of the substituted naphthalenes below,

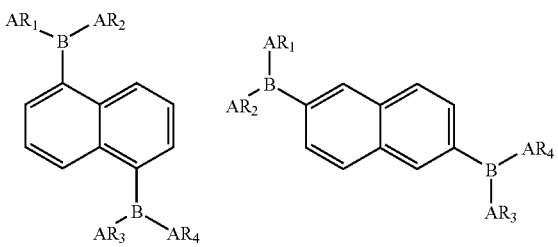

or Aryl in the formula (I) or (II) can correspond to the substituted fluorene below,
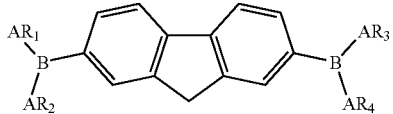
or Aryl in the formula (I) or (II) can correspond to one of the substituted phenanthrenes below,
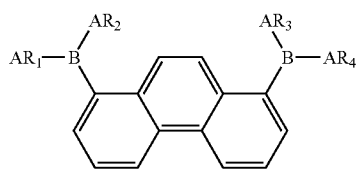
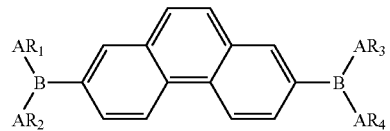
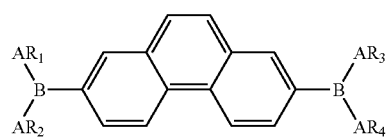
or Aryl in the formula (I) or (II) can correspond to one of the substituted 1,3,5-triphenylbenzenes, pyrenes, perylenes, chrysenes, trypticenes, [2.2]paracyclophanes, 1,1'-ferrocenes below,
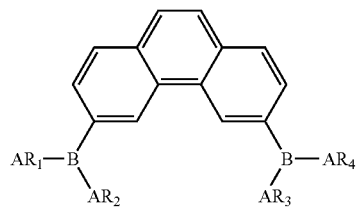
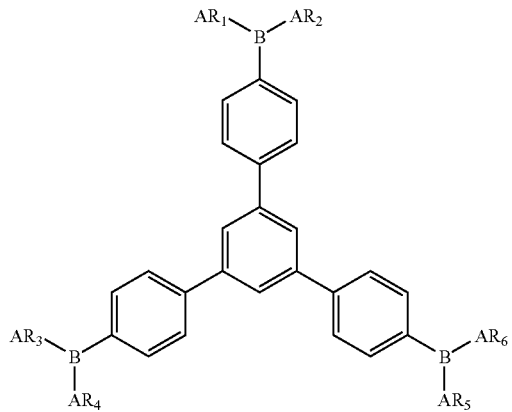
-continued
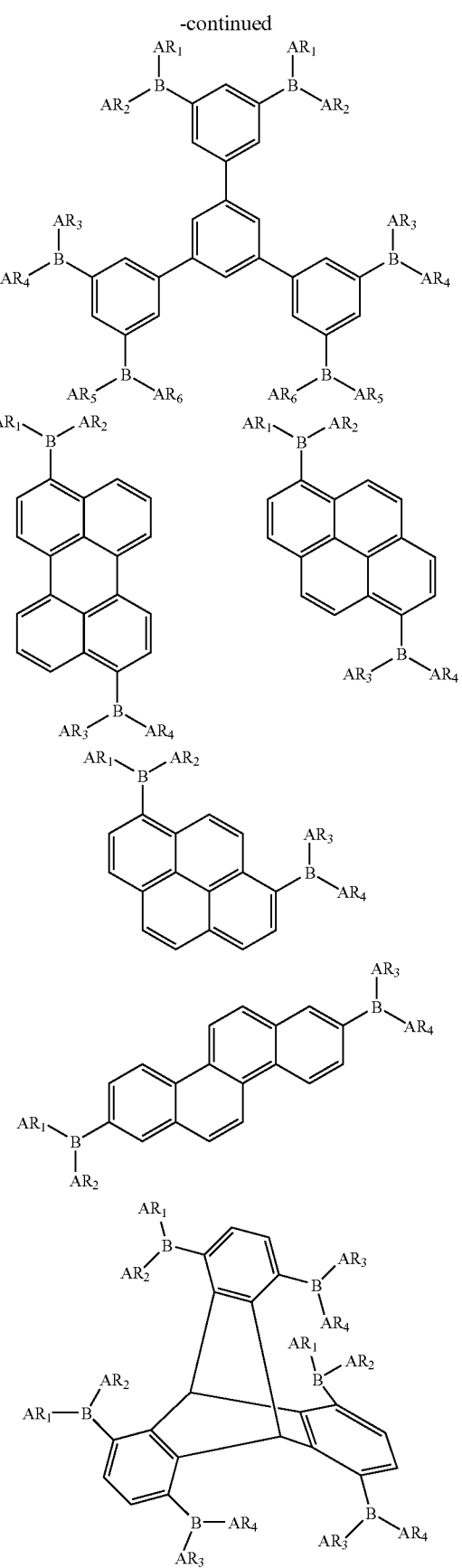

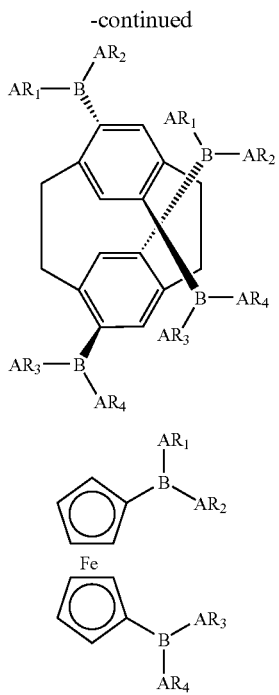

or Aryl in the formula (I) or (II) can, as already mentioned above, also be a heteroaryl radical. Examples are given below:

Aryl in the formula (I) or (II) can correspond to one of the substituted pyridines, pyridazines, 4,5-benzopyridazines, pyrimidines, pyrazines below,

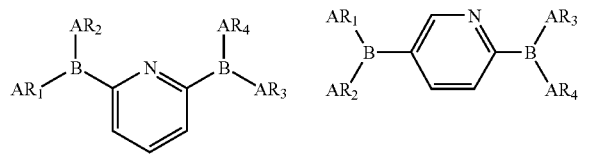

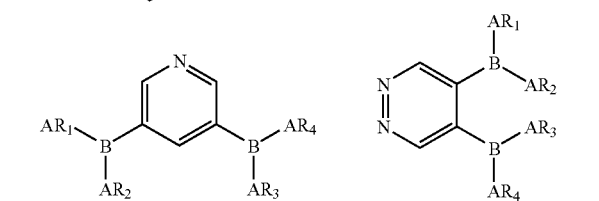

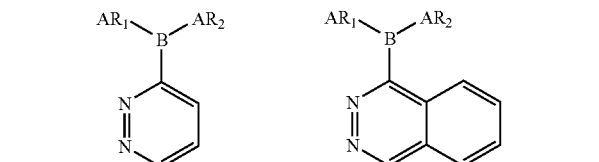

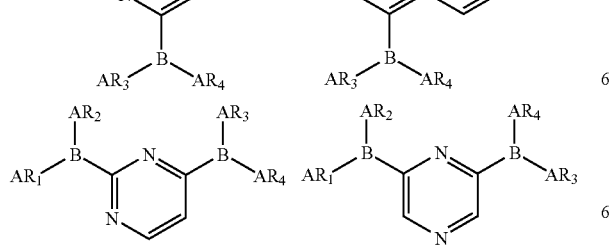

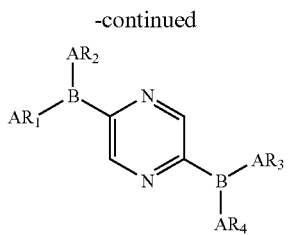

or Aryl in the formula (I) or (II) can correspond to one of the substituted

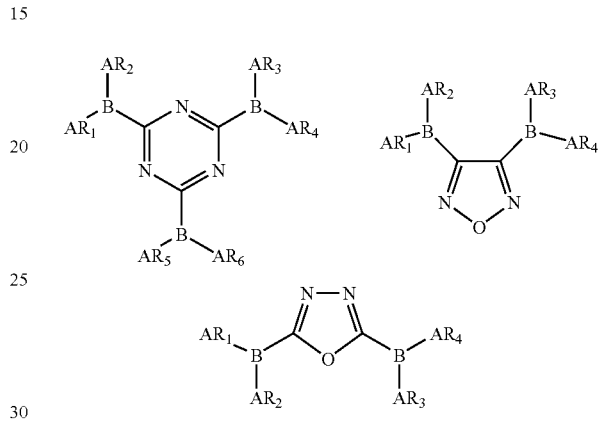

1,3,5-triazines, 1,2,5- or 1,3,4-oxadiazoles below, or Aryl in the formula (I) or (II) can correspond to one of the substituted 2,2'- or 4,4'-diazabiphenyls below:

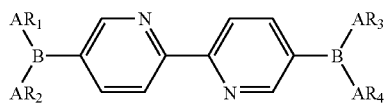

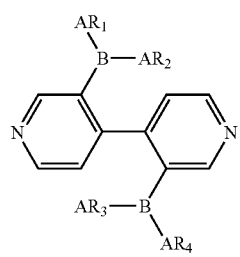

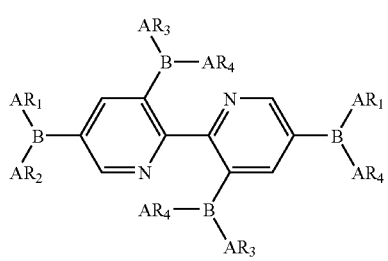

or Aryl in the formula (I) or (II) can correspond to one of the substituted 2,7- or 3,6-carbazoles, 5,10-dialkylphenazines, 10-alkylphenoxazines below:
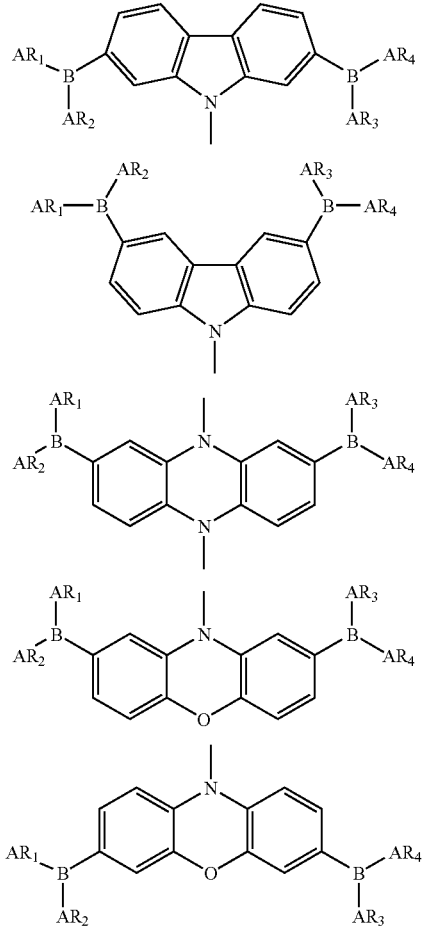
The radicals $AR_1$ to $AR_8$ are each as defined for the radicals $Ar_1$ and $Ar_2$ in the formula (I).
Particular preference is given to the radicals $AR_1$ to $AR_8$ being the following radicals:
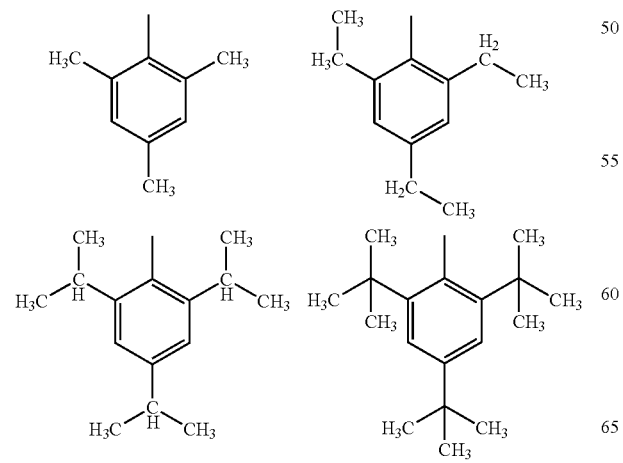
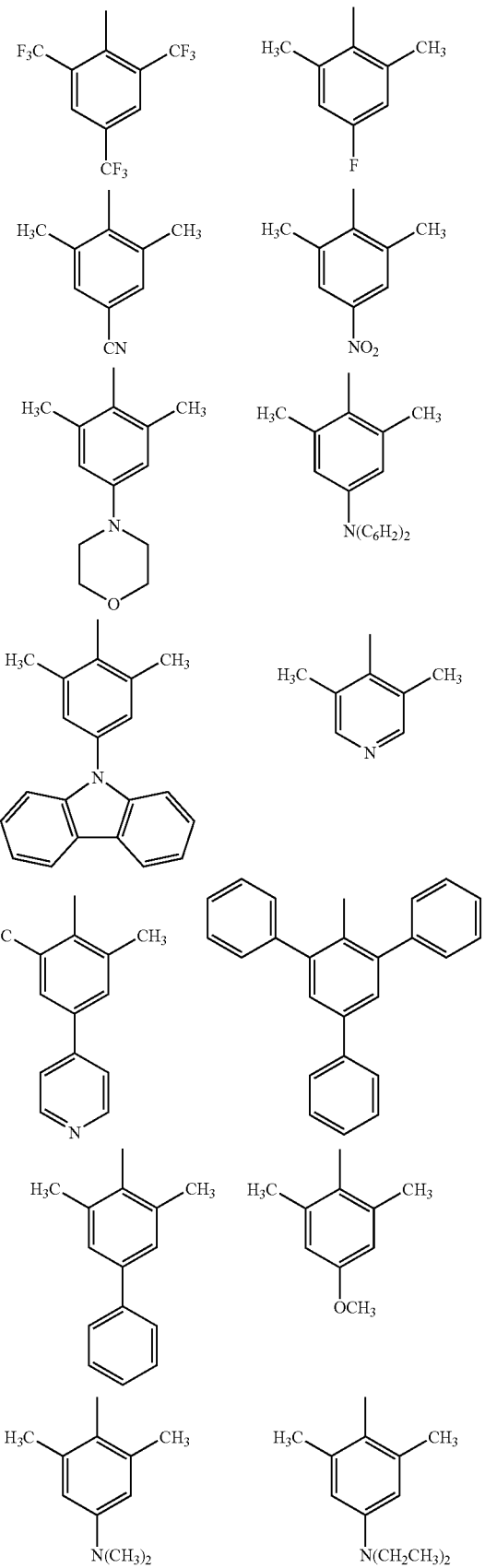

-continued

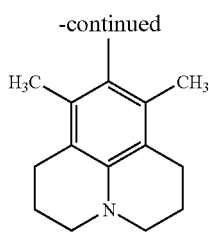

As indicated in the technical explanation, particular preference is given to using compounds of the type listed and described above which do not absorb or absorb only to a very small extent in the visible region (400 to 700 nm).

Boron or aluminum compounds of the formulae (I) and (II) are synthesized, for example, by reaction of a halogenated aromatic (preferably bromoaromatic) with a metal (e.g. Li, Mg), a metal alloy (e.g. Li—Al alloy) or a metal compound (n-, sec-, tert-butyllithium, Grignard compound) and subsequent salt-metathetic reaction with an organoboron-halogen or organoaluminum-halogen compound. The reaction of a lithiated aromatic

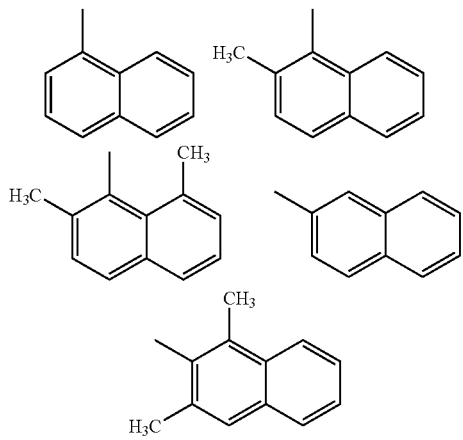

with diarylboron or diarylaluminum halides has been found to be particularly useful, since this method gives, compared to the reactions of Grignard compounds with diarylboron halides described in the literature [A. Schulz, W. Kaim, Chem. Ber., 1989, 122, 1863–1868], significantly better yields.

The synthesis and properties of the above-described boron and aluminum compounds to be used according to the invention is illustrated by the following examples, but is not restricted thereto.

1. Synthesis of Boron and Aluminum Compounds:

The following syntheses were carried out, up to the work-up, in carefully dried reaction vessels under a dry pure nitrogen atmosphere or argon atmosphere using carefully dried solvents. The starting materials used were either purchased from ALDRICH (methyllithium-lithium bromide complex 1.5 M in diethyl ether, n-butyllithium 1.6 M in n-hexane, tert-butyllithium 1.7 M in n-hexane, 1,4-dibromobenzene, 1,3-dibromobenzene, 1,3,5-tribromobenzene, 4,4'-dibromobiphenyl, ferrocene, 2,6-dibromopyridine) and used without further purification or prepared by literature methods (fluorodimesitylborane: A. Pelter, B. Singaram, L. Warren, J. W. Wilson, Tetrahedron 1993, 49, 2965–2978, 1,3,5-tris(trimethylstannyl)benzene: N. Rot, F. J. J. de Kanter, F. Bickelhaupt, W. J. J. Smeets, A. L. Spek, J. Organomet. Chem. 2000, 593–594, 369–379, lithium 4,4'-di-tert-butylbiphenyl: P. K. Freeman, L. L. Hutchinson, J. Org. Chem. 1980, 45, 1924).

EXAMPLE 1

Synthesis of 1,4-bis(dimesitylboryl)benzene 25.9 ml (44 mmol) of a 1.7 M solution of tert-butyllithium in n-hexane was added dropwise to a well-stirred solution of 2.36 g (10 mmol) of 1,4-dibromobenzene in 200 ml of absolute THF which had been cooled to −78° C. over a period of 20 minutes at such a rate that the temperature of the reaction mixture did not exceed −65° C. The solution was stirred for another 1 hour at −78° C. and a solution of 6.44 g (24 mmol) of fluorodimesitylborane in 50 ml of absolute THF was then added dropwise over a period of 20 minutes at such a rate that the temperature of the reaction mixture did not exceed −65° C.

The reaction mixture was allowed to warm to room temperature over a period of 12 hours while stirring. The THF was subsequently removed on a rotary evaporator, the yellow, semisolid residue was taken up in 200 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 5.5 g, purity according to HPLC: 90–95%) was repeatedly recrystallized from n-hexane until a purity of 99.8% as determined by HPLC had been reached. The yield, at a purity of 99.8% as determined by HPLC, was 3.9 g, corresponding to 67.8%.

$^1$H NMR (CDCl$_3$): [ppm]=7.43 (s, H-p-phenylene, 4 H), 6.79 (br. s, H-mes, 8 H), 2.29 (s, CH$_3$, 12 H), 1.98 (s, CH$_3$, 24 H). Thermal data (from DSC): $T_g$~100° C., $T_m$=269° C.

EXAMPLE 2

Synthesis of 1,3-bis(dimesitylboryl)benzene 25.9 ml (44 mmol) of a 1.7 M solution of tert-butyllithium in n-hexane was added dropwise to a well-stirred solution of 2.36 g (10 mmol) of 1,3-dibromobenzene in 200 ml of absolute THF which had been cooled to −78° C. over a period of 20 minutes at such a rate that the temperature of the reaction mixture did not exceed −65° C. The solution was stirred for another 1 hour at −78° C. and a solution of 6.44 g (24 mmol) of fluorodimesitylborane in 50 ml of absolute THF was then added dropwise over a period of 20 minutes at such a rate that the temperature of the reaction mixture did not exceed −65° C.

The reaction mixture was allowed to warm to room temperature over a period of 12 hours while stirring. The THF was subsequently removed on a rotary evaporator, the yellow, semisolid residue was taken up in 200 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 5.5 g, purity according to HPLC: 93–96%) was repeatedly recrystallized from ethyl acetate/n-hexane until a purity of 99.8% as determined by HPLC had been reached. The yield, at a purity of 99.8% as determined by HPLC, was 2.7 g, corresponding to 47.0%.

$^1$H NMR (CDCl$_3$): [ppm]=7.53 (dd, H-4, H-6, $^3$J$_{HH}$=7.3 Hz, $^4$J$_{HH}$=1.3 Hz, 2H), 7.48 (br. s, H-2, 1 H), 7.33 (dt, H-5, $^3$J$_{HH}$=7.3 HZ, $^5$J$_{HH}$=0.6 Hz, 1 H), 6.78 (br. s, H-mes, 8 H), 2.28 (s, CH$_3$, 12 H), 1.95 (s, CH$_3$, 24H). Thermal data (from DSC): T$_g$~87° C., T$_m$=169° C.

EXAMPLE 3

Synthesis of 1,3,5-tris(dimesitylboryl)benzene

Variant A:

40.0 ml (60 mmol) of a 1.5 M solution of methyllithium-lithium bromide complex in diethyl ether was added dropwise to a well-stirred solution of 5.67 g (10 mmol) of 1,3,5-tris(trimethylstannyl)benzene in 300 ml of absolute THF which had been cooled to −78° C. over a period of 15 minutes. The reaction mixture was subsequently warmed to −50° C., stirred at −50° C. for 45 minutes, cooled back down to −78° C. and a solution of 16.09 g (60 mmol) of fluorodimesitylborane in 150 ml of absolute THF was then added dropwise over a period of 20 minutes at such a rate that the temperature of the reaction mixture did not exceed −65° C. The reaction mixture was allowed to warm to room temperature over a period of 12 hours while stirring. The THF was subsequently removed on a rotary evaporator, the yellow, semisolid residue was taken up in 200 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 8 g, purity according to HPLC: 70–75%) was repeatedly recrystallized from ethyl acetate/n-hexane until a purity of 99.8% as determined by HPLC had been reached. The yield, at a purity of 99.8% as determined by HPLC, was 4.4 g, corresponding to 53.4%.

Variant B:

140.0 ml (70 mmol) of a 0.5 M solution of lithium 4,4'-di-tert-butylbiphenyl in THF was added dropwise to a well-stirred solution of 3.15 g (10 mmol) of 1,3,5-tribromobenzene in 300 ml of absolute THF which had been cooled to −78° C. over a period of 15 minutes. The reaction mixture was subsequently warmed to −40° C., and stirred at −40° C. for 45 minutes. A 0.25 M solution of tert-butyl chloride in THF was added dropwise to the blue-green reaction mixture until a color change to brown occurred. The solution was subsequently cooled back down to −78° C. and a solution of 10.73 g (40 mmol) of fluorodimesitylborane in 100 ml of absolute THF was then added dropwise over a period of 20 minutes at such a rate that the temperature of the reaction mixture did not exceed −65° C. The reaction mixture was allowed to warm to room temperature over a period of 12 hours while stirring. The THF was subsequently removed on a rotary evaporator, the yellow, semisolid residue was taken up in 200 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 8 g, purity according HPLC: 80–85%) was repeatedly recrystallized from ethyl acetate/n-hexane until a purity of 99.8% as determined by HPLC had been reached. The yield, at a purity of 99.8% as determined by HPLC, was 5.1 g, corresponding to 62.0%.

$^1$H NMR (CDCl$_3$): [ppm]=7.51 (s, H-2, H-4, H-6, 3 H), 6.73 (br. s, H-mes, 12 H), 2.29 (s, CH$_3$, 18 H), 1.88 (s, CH$_3$, 36 H). Thermal data (from DSC): T$_g$~98° C., T$_m$=239° C.

EXAMPLE 4

Synthesis of 4,4'-bis(dimesitylboryl)biphenyl 28.5 ml (48 mmol) of a 1.7 M solution of tert-butyllithium in n-hexane was added dropwise to a well-stirred suspension of 3.12 g (10 mmol) of 4,4'-dibromobiphenyl in 200 ml of absolute THF which had been cooled to −78° C. over a period of 20 minutes at such a rate that the temperature of the reaction mixture did not exceed −65° C. The suspension was stirred at −78° C. for another 1 hour and a solution of 6.44 g (24 mmol) of fluorodimesitylborane in 100 ml of absolute THF was then added dropwise over a period of 20 minutes at such a rate that the temperature of the reaction mixture did not exceed −65° C.

The reaction mixture was allowed to warm to room temperature over a period of 12 hours while stirring. The THF was subsequently removed on a rotary evaporator, the yellow, semisolid residue was taken up in 400 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 6.5 g, purity according to HPLC: 95–98%) was repeatedly recrystallized from dioxane and chloroform until a purity of 99.9% as determined by HPLC had been reached. The yield, at a purity of 99.9% as determined by HPLC, was 4.3 g, corresponding to 66.0%.

$^1$H NMR (CDCl$_3$): [ppm]=7.64, 7.58 (d, H-2-und H-3-biphenylene, $^2$J$_{HH}$=8.4 Hz, 8 H), 6.83 (br. s, H-mes, 8H), 2,31 (s, CH$_3$, 12H), 2.03 (s, CH$_3$, 24 H). Thermal data (from DSC): T$_g$~114° C., T$_m$=263° C.

EXAMPLE 5

Synthesis of 1,1'-bis(dimesitylboryl)ferrocene 15.4 ml (24.7 mmol) of a 1.6 M solution of n-butyllithium in n-hexane were added dropwise to a mixture of 2.87 g=3.7 ml (24.7 mmol) of N,N,N',N'-tetramethylethylenediamine and 4 ml of n-hexane over a period of 5 minutes while stirring at room temperature. The reaction mixture was stirred for another 20 minutes at room temperature and a solution of 1.86 g (10 mmol) of ferrocene in 70 ml of n-hexane was then added dropwise over a period of 25 minutes. The reaction mixture was stirred at room temperature for 6 hours and a solution of 6.62 g (24.7 mmol) of fluorodimesitylborane in n-hexane was then added dropwise over a period of 30 minutes. After stirring at room temperature for 16 hours the n-hexane was removed on a rotary evaporator, the red, semisolid residue was taken up in 400 ml of dichloromethane, the organic phase was admixed with 3 ml of water, stirred vigorously for 30 minutes and subsequently dried over magnesium sulfate. After the desiccant had been filtered off, the organic phase was evaporated to dryness. The red crude product (about 6.8 g, purity according to HPLC: 95–98%) was stirred once with hot n-hexane and subsequently recrystallized from ethanol until a purity of 99.8% as determined by HPLC had been reached. The yield, at a purity of 99.8% as determined by HPLC, was 4.7 g, corresponding to 68.8%.

$^1$H NMR (CDCl$_3$): [ppm]=6.75 (br. s, H-mes, 8 H), 4.74, 4.42 (s, H-Cp, 8 H), 2.28 (br. s, CH$_3$, 36 H).

EXAMPLE 6

Synthesis of 2,6-bis(dimesitylboryl)pyridine 15.0 ml (24 mmol) of a 1.6 M solution of n-butyllithium in n-hexane were added dropwise to 30 ml of THF which had bee cooled to −78° C. over a period of 5 minutes while stirring. A solution of 2.37 g (10 mmol) of 2,6-dibromopyridine in 70 ml of THF was added dropwise to this mixture over a period of 15 minutes while stirring at such a rate that the temperature did not exceed −65° C. The reaction mixture was stirred at −78° C. for another 15 minutes and a solution of 6.44 g (24 mmol) of dimesitylboryl fluoride in 100 ml of THF was then added dropwise over a period of 30 minutes. The reaction mixture was allowed to warm to room temperature over a period of 12 hours while stirring. The THF was subsequently removed on a rotary evaporator, the yellow, semisolid residue was taken up in 400 ml of dichloromethane, the organic phase was admixed with 3 ml of water, stirred vigorously for 30 minutes and subsequently dried over magnesium sulfate. After the desiccant had been filtered off, the organic phase was evaporated to dryness. The yellow crude product (about 5.7 g, purity according to HPLC: 96–97%) was repeatedly recrystallized from chloroform or ethyl acetate/ethanol until a purity of 99.9% as determined by HPLC had been reached. The yield, at a purity of 99.9% as determined by HPLC, was 3.6 g, corresponding to 62.6%.

$^1$H NMR (CDCl$_3$): [ppm]=8.14, (t, H-3, $^3J_{HH}$=6.3 Hz, 1 H), 7.63 (d, H-2, $^3J_{HH}$=6.3 Hz, 2 H), 6.90 (br. s, H-mes, 8 H), 2.33 (s, CH$_3$, 12 H), 2.10 (s, CH$_3$, 24 H).

2. Production and Characterization of Phosphorescent OLED Devices Comprising the Compounds of the Invention.

The production of LEDs was carried out by the general method outlined below. Naturally, it had to be adapted in each particular case to the respective circumstances (e.g. variation of the layer thicknesses to achieve optimal efficiency or color).

General Method of Producing OLEDs:

After the ITO-coated substrates (e.g. glass support, PET film) have been cut to the correct size, they are cleaned in a number of cleaning steps in an ultrasonic bath (e.g. soap solution, Millipore water, isopropanol).

They are dried with the aid of an N$_2$ gun and stored in a desiccator. Before vapor deposition of the organic layers, the substrates are treated by means of an ozone plasma apparatus for about 20 minutes. It can be advisable to use a polymeric hole injection layer as first organic layer. This is generally a conjugated, conductive polymer, e.g. a polyaniline derivative (PANI) or a polythiophene derivative (e.g. PEDOT from BAYER). This is then applied by spin coating.

The organic layers are applied in order by vapor deposition in a high-vacuum unit. The thickness of the respective layer and the vapor deposition rate are precisely monitored or set with the aid of a crystal oscillator.

It is also possible, as described above, for individual layers to consist of more than one compound, i.e. in general a host material doped with a guest material. This is achieved by covaporization from two or more sources.

Electrodes are then applied to the organic layers. This is generally achieved by thermal vapor deposition (Balzer BA360 or Pfeiffer PL S 500). The transparent ITO electrode as anode and the metal electrode (e.g. Ca, Yb, Ba—Al) as cathode are subsequently applied and the device parameters are determined.

What is claimed is:

1. A phosphorescent OLED device which comprises a substituted boron or aluminum compound of the formula (I)

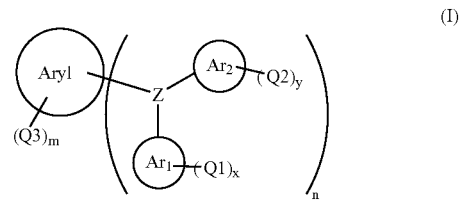

wherein

Aryl is benzene, biphenyl, 1,2-terphenyl, 1,3-terphenyl, 1,4-terphenyl, tetraphenyl, naphthalene, fluorene, phenanthrene, 1,3,5-triphenylbenzene, pyrene, perylene, chrysene, trypticene, [2.2]paracyclophane, ferrocene, pyridine, pyridazine, 4,5-benzopyridazine, pyrimidine, pyrazine, 1,3,5-triazine, pyrrole, indole, 1,2,5-oxadiazole, 1,3,4-oxadiazole, 2,2'-diazabiphenyl, 4,4'-diazabiphenyl, quinoline, carbazole, 5,10H-dihydrophenazine, 10H-phenoxazine, xanthene or 9-acridine;

Ar$_1$ and Ar$_2$ are identical or different on each occurrence and are each phenyl, 1-naphthyl, 2-naphthyl, 1-anthracenyl, 2-anthracenyl, 9-anthracenyl, 2-pyridinyl, 3-pyridinyl, 4-pyridinyl, 2-pyrimidinyl, 4-pyrimidinyl, 5-pyrimidinyl, 2-pyrazinyl, 3-pyridazinyl, 4-pyridazinyl, 2-quinolinyl, 3-quinolinyl, 4-quinolinyl, 5-quinolinyl, 6-quinolinyl, 7-quinolinyl, 8-quinolinyl, 2-pyrrolyl, 3-pyrrolyl, 2-furanyl, 3-furanyl or 2-(1,3,4-oxadiazol)yl;

Q1, Q2 and Q3 are identical or different on each occurrence and are each CN, F, Cl or a straight-chain or branched or cyclic alkyl or alkoxy group which has from 1 to 20 carbon atoms and in which one or more nonadjacent CH$_2$ groups is optionally replaced by —O—, —S—, —CO—, —COO—, —O—CO—, —NR$^1$—, —(NR$^2$R$^3$)$^+$A$^-$ or —CONR$^4$— and one or more H atoms is optionally replaced by F, or an aryl or heteroaryl group which has from 4 to 14 carbon atoms and is optionally substituted by one or more CN, F, Cl or a straight-chain or branched or cyclic alkyl or alkoxy group which has from 1 to 20 carbon atoms and in which one or more nonadjacent CH$_2$ groups is optionally replaced by —O—, —S—, —CO—, —COO—, —O—CO—, —NR$^1$—, —(NR$^2$R$^3$)$^+$ A$^-$or —CONR$^4$— and one or more H atoms is optionally replaced by F;

A$^-$ is a singly charged anion or its equivalent;

R$^1$, R$^2$, R$^3$ and R$^4$ are identical or different and are each H or an aliphatic or aromatic hydrocarbon radical having from 1 to 20 carbon atoms;

m are identical or different and are each 0, 1, 2, 3, 4 or 5;
x are identical or different and are each 0, 1, 2, 3, 4 or 5;
y are identical or different and are each 0, 1, 2, 3, 4 or 5;
n is 2, 3, 4, 5 or 6;
Z is boron or aluminum.

2. The device as claimed in claim 1, wherein the radicals Ar$_1$ and Ar$_2$ are identical or different and are each phenyl, 1-naphthyl or 2-naphthyl.

3. The device as claimed in claim 1, wherein Z is boron.

4. A phosphorescent OLED device which comprises a compound of the formula (II)

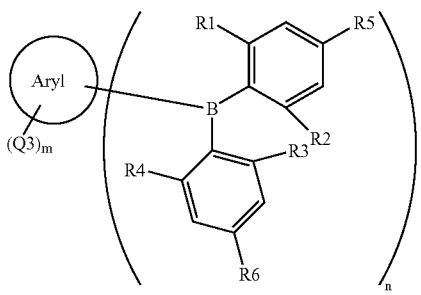

(II)

wherein
- Aryl is benzene, biphenyl, 1,2-terphenyl, 1,3-terphenyl, 1,4-terphenyl, tetraphenyl, naphthalene, fluorene, phenanthrene, 1,3,5-triphenylbenzene, pyrene, perylene, chrysene, trypticene, [2.2]paracyclophane, ferrocene, pyridine, pyridazine, 4,5-benzopyridazine, pyrimidine, pyrazine, 1,3,5-triazine, pyrrole, indole, 1,2,5-oxadiazole, 1,3,4-oxadiazole, 2,2'-diazabiphenyl, 4,4'-diazabiphenyl, quinoline, carbazole, 5,10H-dihydrophenazine, 10H-phenoxazine, xanthene or 9-acridine;
- $Ar_1$ and $Ar_2$ are identical or different on each occurrence and are each phenyl, 1-naphthyl, 2-naphthyl, 1-anthracenyl, 2-anthracenyl, 9-anthracenyl, 2-pyridinyl, 3-pyridinyl, 4-pyridinyl, 2-pryrimidinyl, 4-pyrimidinyl, 5-pyrimidinyl, 2-pyrazinyl, 3-pyridazinyl, 4-pyridazinyl, 2-quinolinyl, 3-quinolinyl, 4-quinolinyl, 5-quinolinyl, 6-quinolinyl, 7-quinolinyl, 8-quinolinyl, 2-pyrrolyl, 3-pyrrolyl, 2-furanyl, 3-furanyl or 2-(1,3,4-oxadiazol)yl;
- n is 2, 3, 4, 5 or 6;
- R1, R2, R3 and R4 are identical or different and are each an alkyl, alkyloxy, aryl radical having from 1 to 20 carbon atoms or a corresponding fluoroalkyl or fluoroalkoxy radical;
- R5 and R6 are identical or different and are each H, CN, F, Cl, Br, I, a straight-chain, branched or cyclic alkyl or alkoxy group, a thioalkyl group, thioaryl group, a nitro group, a diarylamine group, dialkylamino group, an ester group, amide group or carboxyl group;
- Q3 are identical or different on each occurrence and are each CN, F, Cl or a straight-chain or branched or cyclic alkyl or alkoxy group which has from 1 to 20 carbon atoms and in which one or more nonadjacent $CH_2$ groups is optionally replaced by —O—, —S—, —CO—, —COO—, —O—CO—, —$NR^1$—, —$(NR^2R^3)^+A^-$ or —$CONR^4$— and one or more H atoms is optionally replaced by F, or an aryl or heteroaryl group which has from 4 to 14 carbon atoms and is optionally substituted by one or more CN, F, Cl or a straight-chain or branched or cyclic alkyl or alkoxy group which has from 1 to 20 carbon atoms and in which one or more nonadjacent $CH_2$ groups is optionally replaced by —O—, —S—, —CO—, —COO—, —O—CO—, —$NR^1$—, —$(NR^2R^3)^+A^-$ or —$CONR^4$— and one or more H atoms is optionally replaced by F;
- $A^-$ is a singly charged anion or its equivalent;
- $R^1$, $R^2$, $R^3$ and $R^4$ are identical or different and are each hydrogen or an aliphatic or aromatic hydrocarbon radical having from 1 to 20 carbon atoms;
- m is 0, 1, 2, 3, 4 or 5.

5. The device as claimed in claim 4, wherein at least two boron substituents are identical.

6. The device as claimed in claim 5, wherein at least three boron substituents are identical.

7. The device of claim 1, wherein at least compound of the formula (1) is an electron transport material.

8. The device of claim 1, wherein there is an emission layer comprising at least compound of the formula (1).

9. The device of claim 1, wherein there is a hole blocking layer which comprises at least compound of the formula (1).

* * * * *